United States Patent [19]

Yano et al.

[11] Patent Number: 5,293,389
[45] Date of Patent: Mar. 8, 1994

[54] MULTI-PULSE LASER BEAM GENERATION METHOD AND DEVICE AND LASER BEAM MACHINING METHOD AND APPARATUS USING MULTI-PULSE LASER BEAM

[75] Inventors: Makoto Yano, Mito; Kouji Kuwabara, Hitachi, both of Japan

[73] Assignee: Hitachi, Ltd., Tokyo, Japan

[21] Appl. No.: 760,945

[22] Filed: Sep. 17, 1991

[30] Foreign Application Priority Data

Sep. 19, 1990 [JP] Japan ................... 2-246976

[51] Int. Cl.$^5$ ............................................. H01S 3/13
[52] U.S. Cl. .................................. 372/30; 372/21; 372/6; 372/27; 372/23; 385/11
[58] Field of Search ............................. 372/30–32, 372/6, 27; 385/11

[56] References Cited

U.S. PATENT DOCUMENTS 4,451,923 5/1984 Hansch et al. ................... 372/27
4,685,107 8/1987 Kafka et al. ..................... 372/6

*Primary Examiner*—Léon Scott, Jr.
*Attorney, Agent, or Firm*—Antonelli, Terry, Stout & Kraus

[57] ABSTRACT

A method and a device are provided for generating a multi-pulse laser beam including at least three laser beams, from a single pulse laser beam oscillated from a single laser beam source and a method and an apparatus using the pulse generator for laser beam machining with a two-wavelength multi-pulse laser beam suitable for fine-patterning a multi-layered circuit board formed of metal thin films and resin layers or ceramic bodies. One pulse laser beam from the laser beam source is separated into linear polarized laser beams in first and second directions by a polarization beam splitter, with the beam in the first direction being outputted as a first pulse beam of the multi-pulse beam. The beam in the second direction is incident to a combination of an optical fiber or a glass plate and a ¼ wavelength plate, and is delayed and non-linearly polarized there to become a delayed and non-linearly polarized laser beam. The laser beam is again incident to the polarization beam splitter, where the delayed non-linearized pulse beam separated in the first direction is outputted as a second pulse beam of the multi-pulse laser beam. The delayed non-linearized pulse beam separated in the second direction is passed again through the above-described delay and non-linearization loop to generate a third pulse beam.

22 Claims, 5 Drawing Sheets

CERAMIC/GLASS PROCESSING

CROSS SECTION OF
OBJECT TO BE PROCESSED

HOLE

MULTI-PULSE LASER BEAM GENERATION METHOD AND DEVICE AND LASER BEAM MACHINING METHOD AND APPARATUS USING MULTI-PULSE LASER BEAM

BACKGROUND OF THE INVENTION

The present invention relates to a multi-pulse laser beam generation method and a device therefor and a laser beam machining method and an apparatus using a multi-pulse laser beam, and more particularly to a method and a device for converting one laser-pulse beam into two-wavelength multi-pulse laser beams and a laser beam machining method and an apparatus using a two-wavelength multi-pulse laser beam.

As a conventional multi-pulse laser beam generator, a delayed pulse laser beam generator has been disclosed in JP-A-62-123788 (NEC) laid open on Jun. 16, 1987. The delayed laser beam pulse generator includes first and second polarizers of similar characteristics for transmitting or reflecting an input laser beam of circular polarization to split the input laser beam into P-polarized and S-polarized beams, a polarization rotation device disposed between these polarizers for rotating by 90 degrees the polarized laser beam of the P-polarization or S-polarization reflected by the first polarizer, and a total reflection mirror for forming an optical path for a laser beam, and converts a laser beam of circular polarization into a laser beam of linear polarization having two mutually orthogonal axes with a delay time, to thereby provide a delayed pulse laser beam. In such a case, pulse beams to be outputted to the outside of the device are limited to two kinds of beam. The prior art device does not use a half-mirror to prevent loss of laser beam energy.

A laser beam machining is suitable for application to a multi-layered board including metal thin layers like conductor wiring layers. It is general that drilling is applied to provide holes on a printed circuit board laminated with metal thin layers and resin layers.

A drilling method to provide holes has been widely distributed because the method has an advantage of batch processing a laminated board. However, as the circuit structure on the printed circuit board has become highly packed, a drilling diameter has also become smaller, raising a problem of poor durability of holed printed circuit boards. Particularly, in the case of a large circuit board used for a large computer, a lot of drilling work is required and it becomes essential to carry out periodical changing of drills for avoiding occurrence of faults on a single circuit board due to damage of the circuit board by a poor drilling work.

A laser beam machining method has recently been studied to replace the above-mentioned drilling method. The laser beam machining method not only eliminates poor circuit boards, but also can cope with providing holes of small diameters such as about 0.3 mm which is difficult to achieve by the mechanical drilling work. Further, the laser beam machining method has an advantage of not applying physical force to a printed circuit board because of its non-contact processing. However, it is difficult to carry out an efficient processing work of a laminated board by using only one laser beam of one wavelength obtained by one laser unit, because a laminated board including laminated layers of different materials such as metal thin films and resin layers has different absorption coefficients of laser beams. Accordingly, two laser beams of two different wavelengths obtained from two different laser units must be used to solve this problem. Examples of this type of device are disclosed in JP-A-01-266983 laid open on Oct. 24, 1989, JP-A-63-273587 laid open on Nov. 10, 1988 and JP-A-01-273684 laid open on Nov. 1, 1989. Techniques relating to laser beam machining are laid open by the JP-A-54-120498, JP-A-63-136546 and JP-A-63-154280.

While the above-described prior art techniques are processing methods taking advantage of characteristics of different laser wavelengths, they have a problem that an overall structure of a device becomes complex and is large-scaled because two completely different types of laser units are used in the system.

SUMMARY OF THE INVENTION

It is an object of the present invention to provide a method and a device for generating a multi-pulse laser beam including at least three pulse beams from one pulse beam generated from one laser beam source.

It is another object of the present invention to provide a laser beam machining method and an apparatus using a multi-pulse laser beam which can efficiently carry out a beam machining operation.

It is still another object of the present invention to provide a method and an apparatus for laser beam machining a brittle body using a single laser beam oscillator.

According to one aspect of the present invention, a method of generating a multi-pulse laser beam comprises the steps of, separating one pulse laser beam oscillated from the pulse laser beam oscillator into two-directional linearly polarized laser beams by a polarization beam splitter (PBS) or polarizer, applying only one of a transmitted beam and a reflected beam to an optical pulse delaying and non-linear polarization unit such as an optical fiber and a glass panel to delay the pulse beam, destroying a linear-polarization state of a laser beam to provide a beam of a non-linear polarization state, applying again the laser beam to the polarization beam splitter or polarizer, and taking out the other of the transmitted beam and the reflected beam as a multi-pulse laser beam.

According to another aspect of the present invention, a multi-pulse laser beam generator is obtained which includes a wavelength conversion section capable of converting the wavelength of only a part of the multi-pulse laser beam obtained from the loop having the above-described structure, to thereby generate a two-wavelength multi-pulse laser beam.

According to another aspect of the present invention, a laser beam machining apparatus including the above-mentioned multi-pulse laser beam generator has a monitoring unit having a light receiving section sensitive to the visible laser beam of a two-wavelength multi-pulse laser beam, so that a laser beam machining state can be monitored by a scattered beam which is generated when a visible laser beam is irradiated on a surface of an object to be processed.

The outline operation of the laser beam generator and the laser beam machining operation using the laser beam generator according to one feature of the present invention will be described.

The operation method may include a step of separating one pulse laser beam oscillated by a pulse laser oscillator into linearly polarized laser beams in first and second directions by a polarization beam splitter or polarizer, a step of delaying only the laser beam in the second direction out of the two separated laser beams by a unit such as an optical fiber or a glass waveguide having a pulse delay function and a non-linear polarization function and changing the delayed laser beam into a non-linear or non-polarized laser beam, and a step of applying an output laser beam from the delay and non-linear polarization unit again to the polarization beam splitter or polarizer to separate the laser beam into linearly polarized laser beams in the first and second direction again. The above steps are repeated. A pulse laser beam which is oscillated from the polarization beam splitter and is returned to the same polarization beam splitter after passing through the delay and non-linear polarization unit is delayed by only the optical path distance, and a laser beam separated in the first direction by the polarization beam splitter is changed into a multi-pulse laser beam. The laser beams in the first and second directions correspond to a transmitted beam and a reflected beam or a reflected beam and a transmitted beam respectively by the beam splitter.

The multi-pulse laser beam includes a first pulse beam $P_1$ which becomes a transmitted beam (P-polarized beam) by the polarization beam splitter and a second pulse beam and subsequent pulse beams $S_2$, $S_3$ and $S_4$ which become reflected beams (S-polarized beams) by the polarization beam splitter, with different polarization directions between the first pulse beam and the second and subsequent pulse beams. Accordingly, in this case, it is possible to set the wavelength conversion section such that only a laser beam having the first pulse beam polarization direction is wavelength-converted. With such an arrangement, a two-wavelength multi-pulse laser beam is provided which includes a first pulse beam $P_1$ that is wavelength converted into a short-wavelength beam and second and subsequent pulse beams $S_2$ to $S_4$ having the same long-wavelength as the pulse beams oscillated from the pulse laser beam oscillator. Alternatively, a multi-pulse laser beam can be similarly provided when the first pulse beam is a reflected beam reflected from the beam splitter and the second and subsequent pulse beams are transmitted beams.

When a laser beam machining operation is applied using a two-wavelength multi-pulse laser beam to provide holes on a laminated printed circuit board including, for example, metal thin films and resin layers, a short-wavelength laser beam with a high absorption coefficient of materials either heats or melts the surface layer of the printed circuit board, so that an absorption coefficient of the long-wavelength laser beam oscillated immediately after that is increased, to thereby achieve a laser beam machining operation to provide holes with high work efficiency.

BRIEF DESCRIPTION OF THE DRAWINGS

FIGS. 1C and 1D are respectively a schematic block diagram and an output pulse waveform diagram showing a substitution of the optical fiber in the device of FIG. 1A or FIG. 1B;

DESCRIPTION OF THE PREFERRED EMBODIMENTS

Figure 1A:
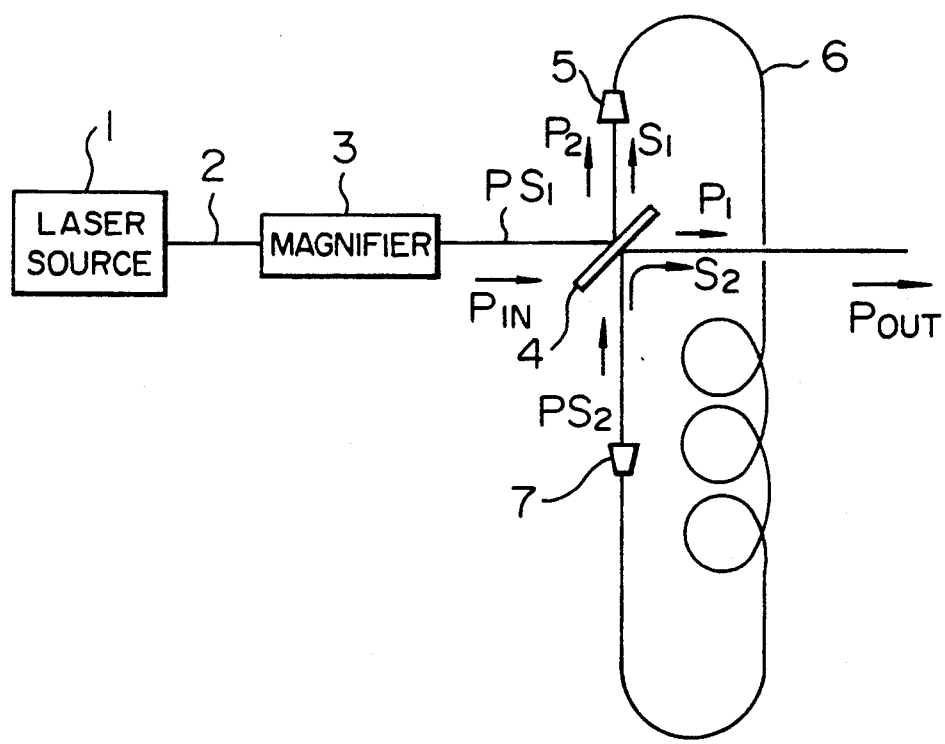
FIG. 1A is a schematic block diagram showing one embodiment of the multi-pulse laser beam generator according to the present invention.

Embodiments of the present invention will be described in detail with reference to the accompanying drawings. In the drawings, the same reference numerals and symbols represent the similar portions elements, and devices.

FIG. 1A schematically shows a laser beam generator in one embodiment of the present invention. In FIG. 1A, a pulse laser beam 2 having a single wavelength is oscillated from a pulse laser beam oscillator or laser source 1 and is expanded by a beam expander 3. A laser beam $PS_1$ applied to a polarization beam splitter or polarizer 4 is split into a transmitted beam $P_1$ and a reflected beam $S_1$. Of the two split beams, the reflected beam $S_1$ is guided into an optical fiber 6 of non-polarization holding type by a fiber input optical system 5 such as a condenser system which uses a lens and is again applied to the polarization beam splitter 4 as a non-linear polarized laser beam $PS_2$ from a fiber output optical system or collimator 7. The laser beam $PS_2$ is split by the splitter 4 into a reflected beam $S_2$ and a transmitted beam $P_2$, in the direction of the previous transmitted beam $P_1$ and in the direction of the previous reflected beam $S_1$, respectively. The transmitted beam $P_2$ is guided into the optical fiber 6 by the fiber input optical system 5, thus forming an optical loop. As described later, the optical fiber 6 is a light transmission material and changes a laser beam of linear polarization that passes through it into a laser beam of non-linear polarization such as non-polarization, circular polarization and elliptical polarization, and time delays the laser beam by the length of an optical path determined by the length of an optical fiber. The optical fiber 6 can be replaced by other means having the two functions of non-linear polarization, and, delaying.

Figure 2A:
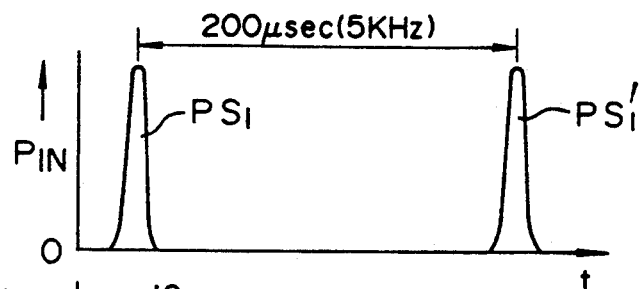
FIGS. 2A and 2B are operation time charts showing an output of an incident beam and an oscillation beam of the laser beam in the present embodiment.
Figure 2B:
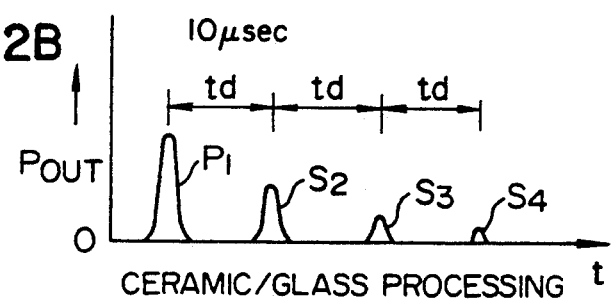

FIGS. 2A and 2B show an example of input and output pulse relation, that is, a relation between a multi-pulse laser beam obtained at the output of the device and an input pulse laser beam and their characteristics, for the case where the component ratios of two-directional linear polarization of the laser beam $PS_1$ applied to the polarization beam splitter 4 are substantially equal, in the above-described configuration. Assume laser beams $PS_1$, $PS'_1$ with a given interval (e.g. 200 $\mu$sec) as incident beams $P_{IN}$, then an output beam $P_{out}$ has a constant pulse distance or the pulse delay time $t_d$ (e.g. 100 nsec) which is determined by the length of the optical fiber 6, to form a multi-pulse train $S_2$ to $S_4$ of which output levels are reduced sequentially each time the laser beam $P_1$ circulates in the loop.

Figure 1B:
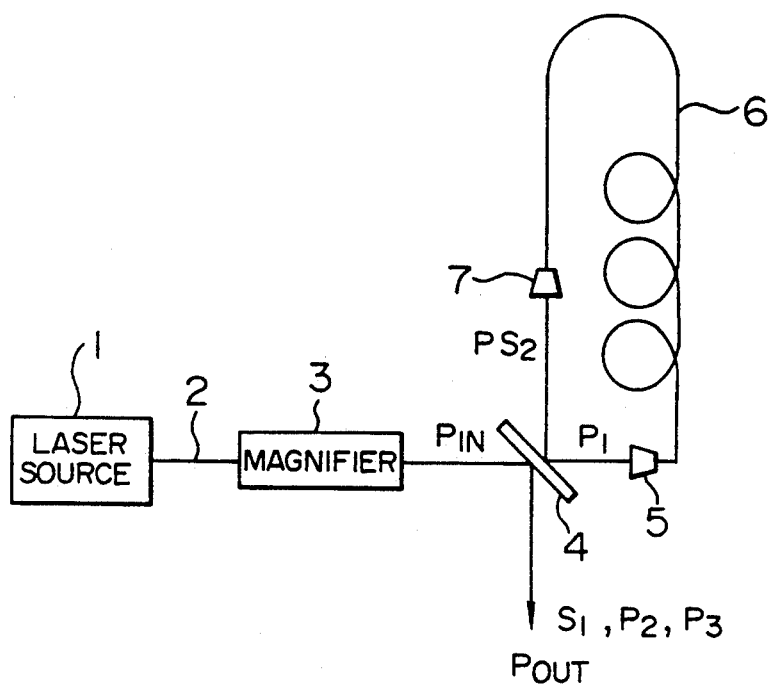
FIG. 1B is a schematic block diagram showing a modification the multi-pulse laser beam generator in FIG. 1A
Figure 1D:
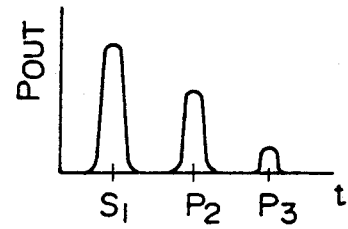
FIG. 1D shows the output pulse relation for FIG. 1B.

FIG. 1B shows a modification of the multi-pulse laser beam generator shown in FIG. 1A, with an output-waveform characteristic. In FIG. 1B, the laser beam $P_{IN}$ which is incident to the polarization beam splitter 4 is separated into the transmitted beam $P_1$ and the reflected beam $S_1$. Then, the transmitted beam $P_1$ is guided into the optical fiber 6 by the condenser system 5 and non-linearized by the fiber output optical system 7, to thereby provide a laser beam of non-linear polarization $PS_2$ delayed by the length of the optical fiber. The laser beam $PS_2$ is again incident to the beam splitter 4. The laser beam is then separated into a transmitted beam $P_2$ and a reflected beam $S_2$ by the beam splitter 4, with the transmitted beam $P_2$ being outputted as a pulse beam of the output $P_{out}$ next to the reflected beam $S_1$ of the multi-pulse beam as shown in FIG. 10. Then, a non-linear laser beam $PS_3$ is similarly generated from the reflected beam $S_2$ and a pulse beam $P_3$ is outputted as the $P_{out}$.

In the present embodiment, the first pulse beam $P_1$ is not superposed with the second pulse beam $S_2$ to make clear the operation of each pulse beam. The distance $t_d$ between the pulses substantially depends on the length l of the optical fiber. Assuming that n represents the refraction factor of the optical fiber, c the optical speed and $t_p$ the pulse width, then the length l of the optical fiber 6 needs to be set to meet $$l > t_p \cdot \frac{c}{n}$$

to secure the distance $t_d$ between the pulse beams. In the case of a general Q-switched pulse YAG laser system, the pulse width $t_p$ is approximately 50 ns. Assuming the fiber refraction factor n to be 1.5 and the optical speed c to be $3 \times 10^8$ m/s, the optical fiber needs to have a minimum length of 10 m to secure 50 ns for the pulse distance $t_d$.

Figure 1C:
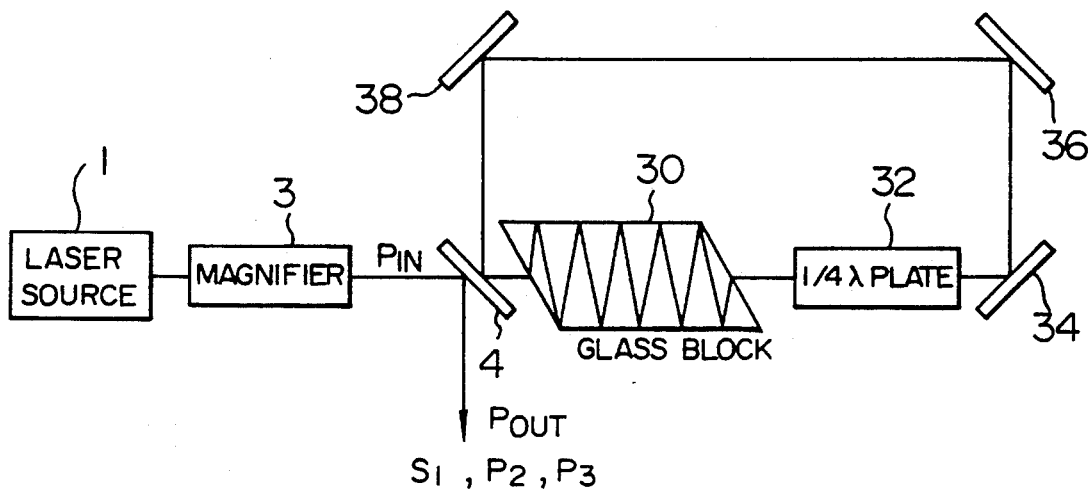

FIG. 1C illustrates a replacement of the optical fiber as a non-linear polarization and delaying unit in the configuration of FIG. 1B. In FIG. 1C, a laser beam of a single pulse which has passed through the polarization beam splitter 4 passes through a glass block 30 which gives a time delay of a delayed optical path length (e.g. more than 10 m) and a known ¼ wavelength panel 32 which changes a linear polarized beam into a circular polarized beam or an elliptically polarized beam, and is reflected by reflection mirrors 34 to 38 which change the direction of the beam, thus being incident again to the beam splitter 4. The glass block may be a quartz plate having demensions of 10 mm × 250 mm × 250 mm with reflection layers. The laser beam $P_2$ which has transmitted the splitter 4 is outputted as the output $P_{put}$ of the multi-pulse laser beam generator, following the reflected beam $S_1$ of the laser beam $P_{IN}$. The operation of the above-mentioned configuration is similar to that of FIG. 1B. A ¼λ retardation plates available from MELLES GRIOT in USA can be utilized as the ¼ wavelength plate.

It should be understood that the configuration of FIG. 1C may be modified to delay the reflected beam from the splitter 4 to non-linearly polarize this beam as shown in FIG. 1A. In the manner as described above, a single-pulse laser beam oscillated from the pulse laser beam oscillator 1 is converted into a multi-pulse laser beam.

Figure 3:
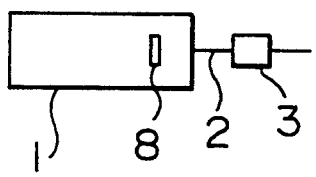
FIG. 3 is a configuration diagram showing another embodiment of the present invention.
Figure 4A:
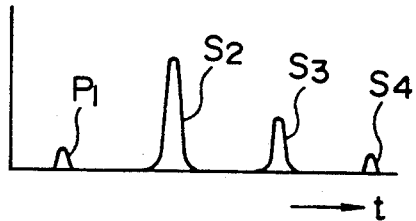
FIGS. 4A and 4B are time charts for explaining the operation of the embodiment in FIG. 3.
Figure 4B:
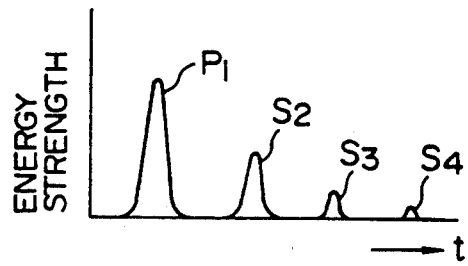

Another embodiment of the present invention will be described with reference to FIG. 3 and FIG. 4. A known polarization direction control device 8 including a Brewster plate and a ¼ wavelength plate is provided inside the pulse laser beam oscillator 1 in the above embodiments, and the angle of the Brewster plate is changed to change the polarization characteristics of the laser beam $PS_1$ which is incident to the polarization beam splitter 4. With such an arrangement, it becomes possible to change the energy intensity of each pulse beam of the multi-pulse laser beam output $P_{out}$, as shown by pulse patterns in FIG. 2 and FIG. 4, for example. In the polarization characteristics of the laser beam $PS_1$, the Brewster plate of the polarization direction control device 8 may be controlled such that the S polarization component beam $S_1$ which is reflected by the polarization beam splitter 4 forms the main portion with a smaller proportion of the transmitted P polarization component beam $P_1$. Thus, the multi-pulse laser beam output $P_{out}$ can provide a pulse train of a desired peak pattern. For example, it is possible to obtain a pulse train of a pulse patterns effective for pre-heat processing of a brittle body, by having a small energy of the first pulse beam $P_1$ and a large energy of the second pulse beam $S_2$ with gradual attenuation thereafter, as shown in FIG. 4A. It is also possible to generate a laser beam of a pulse train having a single attenuation pattern which is effective for a gradual cooling processing, as shown in FIG. 4B.

A polarization direction control device as described above will allow control of the relative quantities of energy between the first pulse beam $P_1$ and the second and subsequent pulse beams $S_2$ to $S_4$ of the multi-pulse laser beam.

Figure 5:
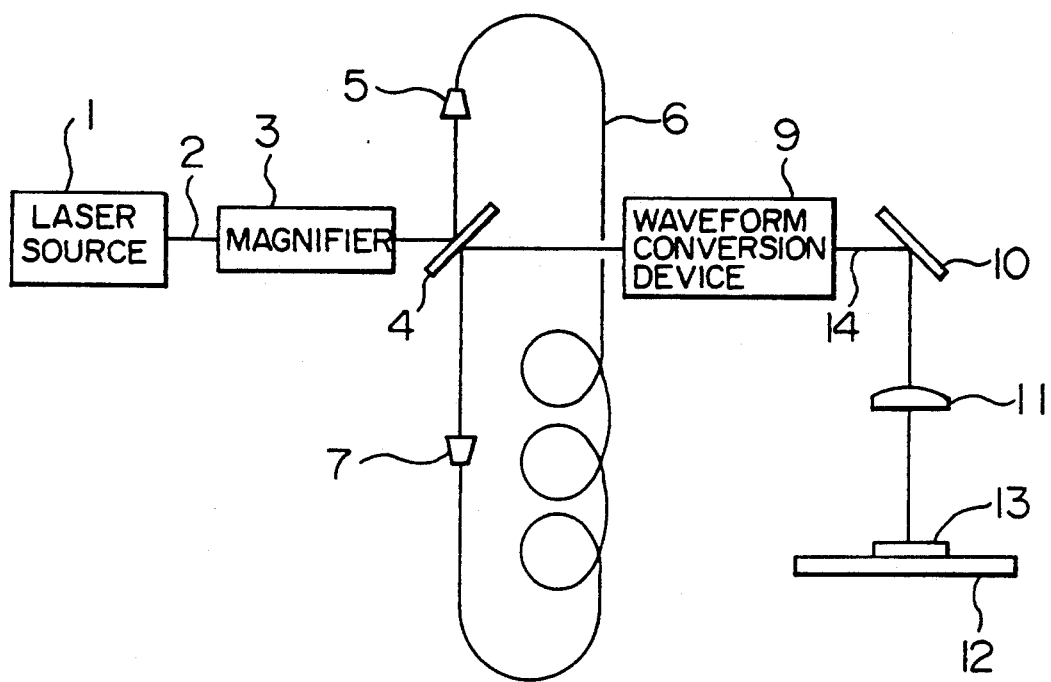
FIG. 5 is a schematic block diagram showing another embodiment of the present invention.
Figure 6:
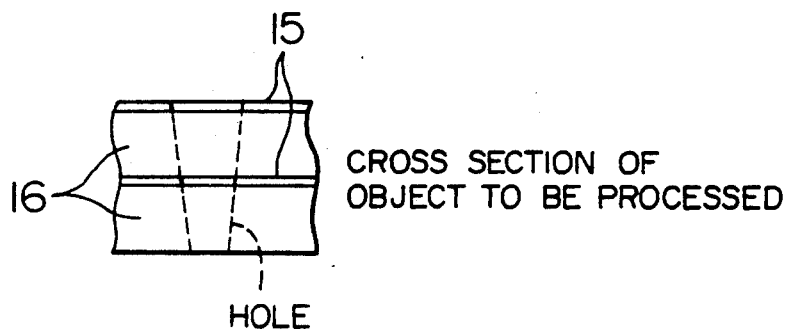
FIG. 6 cross-sectional view of an object to be processed.

FIG. 5 schematically illustrates a laser beam machining apparatus according to one embodiment of the present invention. The laser beam machining apparatus guides the multi-pulse laser beam output $P_{out}$ of any one of the embodiments of FIGS. 1A to 1C, to a condenser optical system 11 by a direction changing reflection mirror 10 through a wavelength conversion portion or device 9, and irradiates the beam onto an object to be processed 13 on a drive table 12. The wave-length conversion portion 9 effectively works on only the laser beam having a specific polarization direction. For example, a wavelength conversion element made of KTP crystal and manufactured by Du Pont may be used. The element is held in a rotatable state. The wavelength conversion element allows a wavelength of 1064 nm of a typical solid YAG laser unit to be reduced to a short wavelength of 532 nm, for example. In the configuration of FIG. 5, when the wavelength conversion device 9 is set to convert the wavelength of the polarization direction of the first pulse $P_1$ among the multi-pulse laser beam $P_{out}$ shown in FIG. 2, the second pulse beam $S_2$ and subsequent beams having a polarization direction different by 90 degrees from that of the first pulse beam $P_1$ are not subjected to wavelength-conversion. Accordingly, the waveform conversion device 9 provides a two-wavelength multi-pulse laser beam 14 in which the first pulse beam $P_1$ has been wavelength-converted into a short-wavelength beam and the second pulse beam $S_2$ and subsequent pulse beams have not been wavelength-converted but have the same wavelength as that of the pulse laser beam 2 obtained from the pulse laser beam oscillator 1. The laser beam 14 thus produced is irradiated on the object 13 to be processed which is a multi-layered or laminated board made of, for example, metal thin film layers 15 and resin layers 16, as illustrated in a cross section in FIG. 6. At first, the first pulse beam $P_1$ which is a short-wavelength beam having a high absorption coefficient of materials heats the surface of the metal thin film layer 15 or eliminates the surface to provide a roughened surface state to thereby increase the absorption coefficient of the non-wavelength conversion beam which follows immediately after that to work on the lower resin layer 16. In this case, the resin layer of the laminated board has a thickness of two to three mm and the metal thin film layer of Cu or Au has a thickness of several $\mu m$ to 100 $\mu m$. Instead of the resin layers, ceramics such as alumina and $Al_2O_3$ are used as a hybrid IC circuit board of 0.6 mm in thickness. The wavelength of the YAG laser beam is 1064 nm at its source. With the power of an average 50 W or below, the multi-pulse width is 100 nsec. or below. The permissible maximum value of the distance $t_d$ between pulses of the oscillated laser beams is determined depending upon the characteristics of heat dispersion of the object to be processed. The second pulse beam $S_2$ may be arranged to irradiate on the object while maintaining the heating state by the irradiation of the first pulse beam $P_1$.

According to the present embodiment, by the use of the two-wavelength multi-pulse laser beam, one pulse laser beam from the laser source can be efficiently used by processing it to modify the surface of the laminated board and to perform the main laser beam machining operation.

Figure 7:
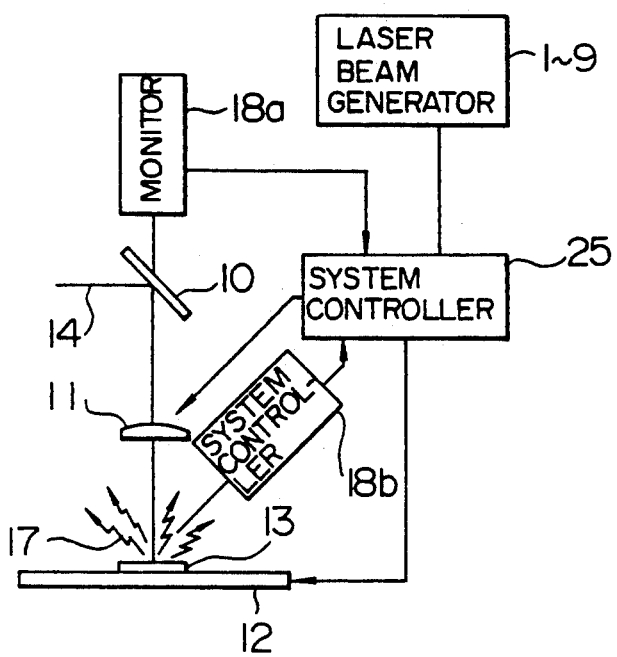
FIG. 7 is a schematic diagram of the laser beam machining apparatus showing still another embodiment of the present invention.
Figure 8A:
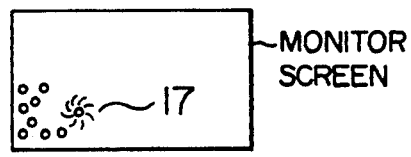
FIGS. 8A and 8B are diagrams of the surface of an object to be worked for explaining the operation of the laser beam machining apparatus.
Figure 8B:

A laser beam machining operation according to another embodiment of the present invention will be described with reference to FIGS. 7, 8A and 8B. In the system of the embodiment shown in FIG. 5, a YAG laser beam TV monitoring unit 18a and/or 18b is provided which includes a display unit and a photoelectric conversion device for receiving a scattered beam 17 that is generated when the two-wavelength multi-pulse laser beam 14 is irradiated on the object 13 to be processed. The monitor 18a or 18b may have a known configuration, of which the output is supplied to an operation controller 25 of the laser beam machining apparatus and is used to control the position of the laser beam machining or the laser beam generator. The machining position on the object 13 to be processed is monitored by the monitor screen shown in FIG. 8A when a workpiece is processed to have holes, for example. Based on the result of monitoring, a positional deviation or error can be corrected. The intensity of the scattered beam 17 is detected to thereby control, the power of the laser beam oscillator 1 and polarization directions and perform on-off controls of the machining operation. The operator can judge from the monitoring screen the progress level of the laser beam machining operation. The laser beam machining apparatus is applicable to a marking operation on an IC package only by way of example. It becomes possible to directly monitor the marking state as shown in FIG. 8B. The oscillation wavelength of the YAG laser beam used is 1064 nm (the infrared rays) and this wavelength is converted to 532 nm (a blue laser beam) by the wavelength conversion device 9. The marking is carried out with the laser beam after the waveform conversion.

According to the present embodiment, the state of a laser beam machining operation any time when required can be monitored, so that the output from the laser beam oscillator can be controlled and any errors are ascertained.

Figure 9:
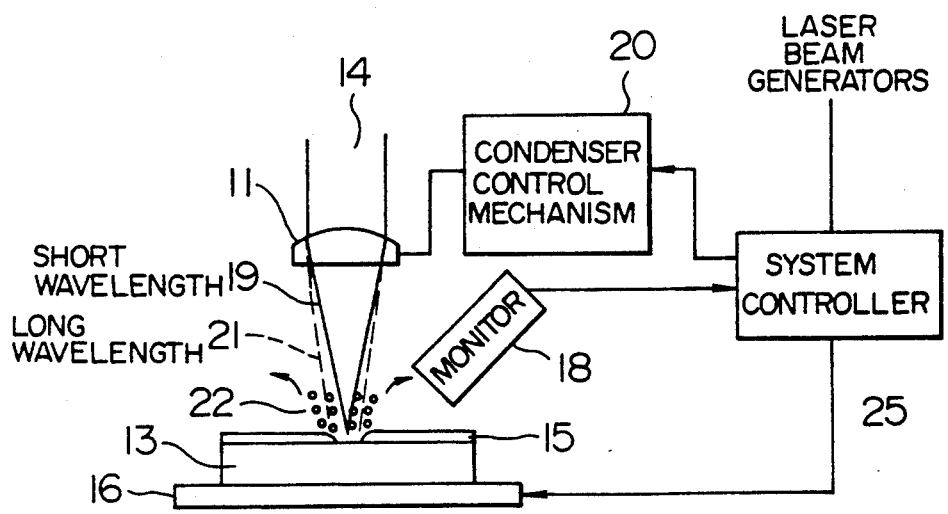
FIG. 9 is an explanatory diagram for a laser beam path in the laser beam machining operation to which the present invention is applied.

Another embodiment of the present invention will be described with reference to FIG. 9. A solid-state laser beam source such as a YAG laser or rubby laser is used to provide a laser beam. The laser-beam machining apparatus includes a condenser optical system 11 for focusing the short-waveform laser beam 19 of the two-wavelength multi-pulse laser beam 14 on the surface of the object to be worked 13 and a control mechanism 20 for vertically moving the lens of the optical system to change the focus position. Since the refraction factor of the lens structuring the condensing optical system 11 is small, a long-wavelength component 21 of the laser beam 14 has a longer focal distance than the short-wavelength laser beam, thus forming an expanded focal point on the surface. In a laser beam machining operation, at first the short-wavelength laser beam 19 is focused on the surface of the object 13 to thereby remove the material of the surface. Scattered particles 22 of the removed material can be completely burnt or sublimated by the non-condensing long-wavelength laser beam 21 which is irradiated immediately after the short-wavelength laser beam 19.

According to the present embodiment, scattered material can be re-heated to provide a satisfactory finish of the object that has been worked.

In accordance with the respective aspects of the present invention, a one-shot pulse laser beam can be converted into a multi-pulse laser beam with a short pulse interval and a damping pulse envelope, so that a gradual cooling can effectively be provided in the laser beam machining operation. Cracks or the like is hardly caused to those portions around a worked portion of a brittle body.

The multi-pulse laser beam may be generated so as to exhibit a first pulse of a small output power and a second pulse of a large output power subsequent to the first pulse, so that it is applicable to pre-heating laser beam machining such as soldering.

A two-wavelength multi-pulse laser beam is also applicable to a laser beam machining of a laminated board including different kinds of materials.

Constant monitoring of a visible beam of the two-wavelength multi-pulse laser beam enables the control of the machining conditions and detection of damages of an intermediate optical system and errors such as failures of the laser beam oscillator.

Re-heating of the scattered materials generated at the time of removing the machined surface can be provided by a laser beam irradiated immediately after the removal to achieve a laser beam machining operation with a satisfactory level of finish.

The whole laser-beam machining system can be constructed using one laser source unit, without requiring a combination of an adjusting visible laser beam and a main laser beam for machining operation to make the system compact, thus requiring no adjusting work for matching the laser beam axes of two sets of laser units.

What is claimed is:

1. A multi-pulse laser beam apparatus comprising: a pulse laser beam oscillator means for oscillating a pulse laser beam; a polarization beam splitter means for separating a pulse laser beam oscillated from said pulse laser beam oscillator means into laser beams in first and second direction and for providing a laser beam in said first direction at an output end of the apparatus; and non-linear polarization and time delay means for non-linearly polarizing a laser beam of said second direction of said laser beams separated into said first and second directions by said polarization beam splitter means and for delaying said non-linearly polarized laser beam by an amount of time by transmission through a length of an optical path constituted by an optically transmissive material so as to direct the delayed laser beam again to said polarization beam splitter means and to output components of the delayed laser beam separated in said first direction by said polarization beam splitter means at said output end.

2. A multi-phase laser beam apparatus according to claim 1, wherein said non-linear polarization and time delay means is formed of an optical fiber having a length l set to satisfy a relationship of $l > t_p \cdot c/n$, where tp represents a pulse width of a laser beam pulse from said pulse laser beam oscillator, c represents a speed of light in a vacuum and n represents a refraction factor of said optical fiber.

3. A multi-pulse laser beam apparatus according to claim 1, further comprising:
   wavelength conversion means including a wavelength conversion element for changing a wavelength of a part of a pulse laser beam of the multi-pulse laser beam from said output end of said multi-pulse laser beam apparatus to produce two-wavelength laser beams containing a short-wavelength and a long-wavelength beam; and
   laser beam applying means for controllably applying said two-wavelength laser beams from said wavelength conversion means to a workpiece to thereby perform a laser beam machine operation on said workpiece.

4. An apparatus according to claim 3, further comprising a monitoring and controlling means for monitoring scattered beams generated when a visible beam of said two-wavelength laser beams of short-wavelength and long-wavelength is applied and for controlling machining conditions based upon the monitoring.

5. An apparatus according to claim 3, further comprising a condenser optical system provided between said wavelength conversion means and such said workpiece, and means for controlling said condenser optical system in a machining operation such that a laser beam of the short-wavelength of said two-wavelength multi-pulse laser beam is focussed on the surface of said workpiece.

6. An apparatus according to claim 3, wherein said workpiece is a multi-layered circuit board formed of metal thin films and resin layers, and the laser beam applying means applies said two-wavelength laser beams from said wavelength conversion means to form holes in said multi-layered circuit board.

7. A multi-pulse laser beam apparatus, comprising: a laser beam oscillation source means for oscillating a pulse laser beam of a single wavelength; a polarization beam splitter means for splitting a pulse laser beam into plural laser beams and having two optical axes of an incidence and an oscillation of a laser beam on each one side of a plate, totalling four optical axes of first, second, third and fourth optical axes on both sides; non-linear polarization means connected to said third and fourth optical axes of said polarization beam splitter means to change on directional laser beam from said polarization beam splitter means into a non-linearly polarized beam; time delay means formed of a light transmissive material, coupled to said non-linear polarization means for providing a time delay to a laser beam by transmission through a length of an optical path constituted by said light transmissive material; and beam direction alteration means for guiding a pulse laser beam having passed through said non-linear polarization means and said time delay means again to said fourth optical axis of said beam splitter means to thereby apply a pulse laser beam to said first optical axis of said polarization beam splitter means from said laser beam oscillation source means and to output a laser beam from said second optical axis as an output multi-pulse laser beam.

8. A multi-pulse laser beam apparatus, comprising: a pulse laser beam oscillator means for oscillating a pulse laser beam; a polarization beam splitter means for separating a pulse laser beam oscillated from said pulse laser beam oscillator mans into laser beams of two directions; non-linear polarization and time delay means for changing one of laser beam separated into two directions by said polarization beam splitter means into a non-linearly polarized laser beam and for providing a time delay to said non-linearly polarized laser beam by transmission through a length of a light transmission material and applying the time delayed laser beam again to said polarization beam splitter means; and wavelength conversion means for wavelength converting a part of a multi-pulse laser beam from said polarization beam splitter means into a pulse laser beam of a different wavelength.

9. A multi-pulse laser beam apparatus according to claim 8, wherein said wavelength conversation means includes a wavelength conversion element for converting a wavelength of a first pulse laser beam to a different wavelength.

10. A multi-pulse laser beam method comprising the steps of: directing a pulse laser beam oscillated from a pulse laser beam oscillator to a polarization beam splitter to separate said pulse laser beam into said laser beams of first and second directions; providing a time delay and non-linear polarization to said laser beam in the first direction by a time delay and non-linear polarization member having a light transmissive material; and applying said laser beam in the first direction again to said polarization beam splitter to generate a multi-pulse laser beam.

11. A method according to claim 10, further comprising a step of rotating the polarization direction of a pulse laser beam which is incident upon said polarization beam splitter through a polarization direction rotating member to thereby control the magnitude of energy of the multi-pulse laser beam.

12. A method according to claim 10, further comprising the steps of:
   converting a part of said generated multi-pulse laser beam into a laser beam of a short-wavelength to provide a two-wavelength laser beam containing the converted-wavelength laser beam and a non-converted laser beam; and
   effecting laser beam machining of a workpiece using said converted-wavelength laser beam and said non-converted-wavelength laser beam.

13. A method according to claim 12, wherein the non-converted-wavelength laser beam has a same wavelength as that of the pulse laser beam oscillated from said pulse laser beam oscillator.

14. A method according to claim 12, further comprising a step of controlling machining conditions for the workpiece monitoring scattered beams generated when a visible beam of said two-wavelength multi-pulse laser beams of different wavelengths is applied onto the object.

15. A method according to claim 12, wherein a condenser optical system is provided between a converter which provides said two-wavelength multi-pulse laser beams of different wavelengths and the workpiece, and further comprising a step of controlling said condenser optical system in a machining operation such that a laser beam of a short-wavelength of said two-wavelength multi-pulse laser beams is focussed on the surface of said workpiece.

16. A method according to claim 12, wherein said workpiece is a multi-layered circuit board formed of metal thin films and resin layers, and the step of effecting laser beam machining of the workpiece includes forming holes in the multi-layered circuit board.

17. A multi-pulse laser beam method comprising the steps of: (a) separating one pulse laser beam oscillated from a pulse laser beam oscillator into linearly polarized laser beams in first and second directions by a polarization beam splitter; (b) applying only one of said two separated laser beams to a non-linear polarization and time delay member constituted by glass material to provide a time delay to said only one of said two separated laser beams and to disturb the linear polarization state thereof; (c) directing the time delayed and non-linear polarized pulse laser beam again to said polarization beam splitter, said polarization beam splitter and said glass material forming a beam circulating loop; and (d) repeating said steps (a) to (c) through said beam circulating loop to output a multi-pulse laser beam from said beam splitter.

18. A multi-pulse laser beam machining system comprising:
a multi-pulse laser beam generator, comprising: a pulse laser beam oscillator means for oscillating a pulse laser beam a polarization beam splitter means for separating a pulse laser beam oscillated from said pulse laser beam oscillator means into laser beams in first and second directions and for applying a laser beam in said first direction to an output end of the generator; and non-linear polarization and time delay means for non-linearly polarizing a laser beam in said second direction from said polarization beam splitter means ad for providing a time delay to said non-linearly polarized laser beam by an amount of time by transmission through a length of an optical path constituted by an optically transmissive material so as to direct the delayed laser beam again to said polarization beam splitter means and to provide the delayed pulse laser beam separated in said first direction by said polarization beam splitter means at said output end;
wavelength conversion means including a wavelength conversion element for changing a wavelength of a part of the pulse laser beam of a multi-pulse laser beam from said output and of said multi-pulse laser beam generator to produce a short-wavelength beam and to pass a remaining part of the pulse laser beam of the multi-pulse laser beams as an original-wavelength beam; and
laser beam applying means for applying said short and original-wavelength laser beams from said wavelength applying conversion means to a workpiece to thereby perform a laser beam machining operation.

19. A method of carrying out laser beam machining using a multi-pulse laser beam, comprising the steps of: generating a multi-pulse laser beam from a single-wavelength pulse laser beam provided by a pulse laser beam oscillator by a multi-pulse laser beam generator; converting a part of said generated multi-pulse laser beam into a laser beam of a short wavelength to provide a two-wavelength laser beam containing the converted-wavelength beam and the non-converted beam; effecting laser beam machining of a workpiece by controllably applying said converted-wavelength laser beam and said non-converted-wavelength laser beam having a same wavelength as that of the pulse laser beam oscillated from said pulse laser beam oscillator.

20. A method according to claim 19, further comprising a step of controlling machining conditions for the workpiece by monitoring scattered beams generated when a visible beam of said two-wavelength multi-pulse laser beams of different wavelengths is applied to the workpiece.

21. A method according to claim 19, wherein a condenser optical system is provided between said multi-pulse laser beam generator for generating said two-wavelength laser beams of different wavelengths and the workpiece, and said condenser optical system is controlled in a machining operation such that a laser beam of a short-wavelength of said two-wavelength multi-pulse laser beams is focused on the surface of said workpiece.

22. A method of laser beam machining for providing holes in a multi-layered circuit board formed of metal thin films and resin layers, comprising the steps of: generating a multi-pulse laser beam by passing a laser beam from a single pulse laser beam oscillator through a loop including a beam splitter and a beam delaying and non-linearly polarizing device; generating a short-wavelength laser beam by converting the wavelength of a part of the generated multi-pulse laser beam using a wavelength conversion element; directing said short-wavelength laser beam generated and a long-wavelength laser beam having a same wavelength as that of the pulse beam oscillated from said pulse laser beam oscillator to said multi-layered circuit boards so as to form holes in said multi-layered circuit board.

* * * * *